METHOD OF PRODUCING A PROTECTIVE LAYER FROM A SEMICONDUCTOR NITROGEN COMPOUND FOR SEMICONDUCTOR PURPOSES
Filed April 28, 1967
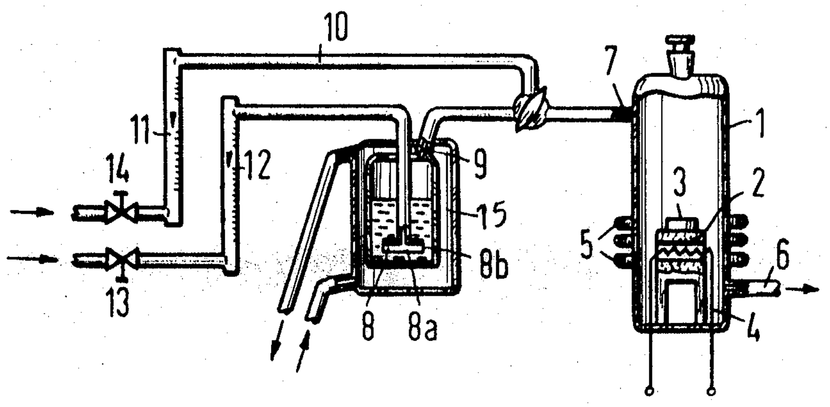

United States Patent Office 3,574,677

Patented Apr. 13, 1971

3,574,677

METHOD OF PRODUCING A PROTECTIVE LAYER FROM A SEMICONDUCTOR NITROGEN COMPOUND FOR SEMICONDUCTOR PURPOSES

Erich Pammer and Horst Panholzer, Munich, Germany, assignors to Siemens Aktiengesellschaft, Berlin, Germany Filed Apr. 28, 1967, Ser. No. 634,614
Claims priority, application Germany, May 2, 1966, S 103,522
Int. Cl. B44d *1/02, 1/18*
U.S. Cl. 117—201 7 Claims

ABSTRACT OF THE DISCLOSURE

A method of producing a protective layer at the surface of a semiconductor crystal. Organic silicon nitrogen compounds are pyrolytically (thermally) precipitated from gaseous phase to form silicon nitride on the semiconductor.

It is known that $SiO_2$ layers on the surface of semiconductor components protect p-n junctions against moisture and other disturbances. For this reason such protective layers are found on the surfaces of planar transistors, such as silicon planar transistors. The protective layers also serve an important function in the production of such transistors by diffusion. During the production of planar transistors, the semiconductor surface is provided with an $SiO_2$ layer, for example by thermal oxidation. Subsequently, individual areas of the semiconductor surface have the $SiO_2$ layer removed therefrom, in order to obtain a local penetration of the activator substance from a gaseous phase, into the semiconductor material. By contrast to those areas from which the $SiO_2$ layer had been removed, the activator cannot or can only to a very insignificant degree penetrate into the semiconductor surface which is coated with the $SiO_2$ layer. Since the p-n junctions thus produced will not reach the freed semiconductor surface, but will remain beneath the protective layer, the $SiO_2$ layer protects the p-n junctions in the finished semiconductor component.

However, the masking capacity of an $SiO_2$ protective layer is better with respect to individual activators. Hence, other protective layer materials were repeatedly sought. Lately, the use of silicon nitride layers has been suggested for this purpose. The silicon nitride layers are precipitated from a gaseous phase, through reaction of $SiH_4$ and ammonia at the surface of the semiconductor crystals, at increased temperature. In layers thus produced, diffusion windows for the actual semiconductor surface, required for the diffusion of activators, may be produced by etching with HF-containing acid mixtures.

Silicon nitride has better masking properties than $SiO_2$ mainly during the diffusion of metallic activators, e.g. zinc or gallium, and results in higher blocking voltages than may be obtained in semiconductor components, provided with comparable $SiO_2$ protective layers. The use of silicon nitride protective layers is analogous to the $SiO_2$ protective layers. For example, field effect transistors possess an even higher control sensitivity, if the control electrode is separated from the semiconductor body by a silicon nitride layer, instead of an equally dimensioned $SiO_2$ layer. The dielectric strength of such nitride layers is better than that of the corresponding $SiO_2$ layers. This is particularly advantageous in field effect transistors whose control electrode is separated from the semiconductor by an insulation layer comprised of silicon nitride, as contrasted to transistors separated by an $SiO_2$ layer, in lieu thereof. Contaminations present in silicon nitride have a considerably lower tendency for the ions to migrate than the contaminations contained in silicon dioxide. The corresponding effect is also on the electrostatic charging of the insulating layers. Also, the silicon nitride layers permit a limiting frequency which is approximately 3–5 times higher. Planar transistors may also be advantageously produced with such protective layers.

The present invention has among its objects the production of such silicon nitride layers in an advantageous way, permitting not only lower growing temperatures for these layers than possible with known methods, but also obtaining better structural characteristics for the protective layer. The layer may be used as a mask as well as for the protection of the obtained structural components. Other semiconductor-nitrogen compounds, for example $Ge_3N_4$ may also be favorably produced as a protective layer by the method of the invention. The invention relates to a method for producing a protective layer from a silicon or germanium nitrogen compound at the surface of a semiconductor crystal, preferably silicon, germanium or an $A^{III}B^{V}$ compound, by means of thermal precipitation of the silicon or germanium nitrogen compound from a gaseous phase. To this end, the present invention provides the use of a reaction gas whose one active component is a metal free, gaseous compound between the nitrogen and the semiconductor, for example, silicon.

Contrary to the aforementioned production of the protective layer from a mixture of ammonia and silicon hydride, according to the method of the invention, the silicon nitrogen compound is already contained in the reaction gas. This difference over the known technique permits our method to use not only lower reaction temperatures, but also simultaneously prevents the occurrence of intermediary products which still contain Si-H compounds, and which may become incorporated in the silicon nitride of the protective layer. Therefore, the protective layer, produced according to the invented method, is more compact than the known $Si_3N_4$ layers, so that still better masking characteristics are obtainable. On the other hand, tests have shown the aforementioned improvements present no obstacle for etching-in diffusion windows, for example by hydrofluoric acid containing etchants.

Among the volatile compounds, which can be used for producing silicon-nitride protective layers, according to the present method, the following should be considered: alkylaminosilane, alkylaminosilazane, siliconisonitrile (silicon isocyanate). These compounds are preferably admixed to a flow of inert carrier gas, for example nitrogen a noble gas or hydrogen. The reaction occurs at the surface of the heated semiconductor crystal. An advantage of using such compounds is that lower melting semiconductor materials, such as germanium, can be coated with the protective layers. On the heated surface, the aforementioned compounds thermally dissociate into dense silicon nitride layers, which adhere very strongly to the substrate. To produce other protective layers, as for example from germanium-nitride, analogous germanium compounds may be used.

During the reaction of halide silanes, for example of $SiCl_4$ with ammonium, a white, non-volatile polymeric solid body of the formula $(Si(NH)_2)_x$ forms in admixture with solid ammonium chloride, via unstable intermediary products, such as $Si(NH_2)_4$ etc. By heating to higher temperatures, this compund converts through several intermediary stages, by splitting out ammonia, into pulverulent, hexagonal silicon nitride, $Si_3N_4$. The process may be illustrated by the following equation:

$$6(Si(NH)_2)_x \xrightarrow{-2xNH_3} 2(Si_3(NH)_3N_2)_x \xrightarrow{-xNH_3} 3(Si_2(NH)N_2)_x \longrightarrow \xrightarrow{-xNH_3} 2xSi_3N_4$$

$(Si(NH)_2)_x$ and its resulting products are not suitable due to their non-volatility for the production of uniform, adhesive and gas-tight silicon-nitride layers to be used as making protective layers for a localized diffusion in semiconductor surfaces. Neither does the reaction of silicon with nitrogen or ammonia (which reaction is usually at 1300° C.) produce a silicon-nitride layer able to perform the desired function. The $Si_3N_4$ which results from such processes is a porous layer at the semiconductor surface, or is even localized as loose crystal needles. The high temperatures, needed in the known method, also promote an undesirable out-diffusion of doping materials from the semiconductor crystals to be coated.

If, however, in accordance with the method of the invention, gaseous, oxygen-free silicon nitrogen compounds are used from the start and if their vapors are passed, if necessary, together with foreign gases onto heated semiconductor surfaces, a pyrolytic precipitation occurs with a deposit of a strongly adhering, clear homogeneous layer of silicon nitride which will be precipitated on said semiconductor surfaces.

The drawing illustrates apparatus suitable for executing the method of the present invention.

In a cylindrical reaction vessel 1, comprised for example of quartz, the semiconductor crystal 3 which is to be coated with the silicon nitride layer, is arranged on a pedestal 2 of the type used in conventional semiconductor epitaxy from a gaseous phase. Heating of the crystal may be effected by means of a resistance heater 4, using the pedestal 2 as a heat resistor, or by means of the induction field of a coil 5 which heats, the pedestal, which is comprised of a conductive and heat-resistant material, to reaction temperature. The consumed reaction gases leave from the reaction vessel via outlet 6 while the fresh gas is introduced into the reaction vessel at point 7 in such a way that said fresh gas may enter into sufficient contact with the semiconductor crystal to be coated. The liquid silicon nitrogen compound 8 is located in a vaporization vessel 8*a*, whose temperature is kept constant via a thermostatic bath 15. A carrier gas is passed through this vessel at 8*b* by means including valve 13 and gas flow meter 12 and leaves the vaporization vessel at point 9, loaded with entrained vapor of the volatile silicon nitrogen compound. A supply path 10 for the pure carrier gas is connected in parallel thereto. The flow of the carrier gas may be controlled by means of gas flow meters 11 and 12 and regulated by means of control valves 13 and 14. The conditions are the same as in hetero-epitaxy.

Several examples to illustrate the invention follow:

EXAMPLE 1

$$S:\left(N\begin{matrix}R\\R\end{matrix}\right)_4 \longrightarrow \text{Si-hitride+hydrocarbon}$$

Si-nitride layers with variable characteristics are obtained according to the temperature range and type as well as the admixture of the foreign gas.

EXAMPLE 2

A carrier gas ($N_2$, argon, $NH_3$ or mixtures thereof) are passed into a fritted wash bottle through liquid tetrakisdimethylaminosilane (melting point 15° C., boiling point 180° C.) so that the gas becomes loaded with the vapors of the compound. The ratio of gas to vapor is preferably adjusted by a regulated temperature bath (possibly by a "bypass"). The gas mixture is now passed into a reactor with the silicon or semiconductor discs which are positioned on a heated substrate (usually carbon heaters coated with quartz glass). The temperature of the discs may be between 500° C., and 1200° C. although it is usually approximately 700° C. Slowly, a dense, transparent coating of silicon nitrides is precipitated on the discs. The thickness of the layer increases linearly with the time. The dissolving speed, especially in etching solutions, of the layers obtained, depends largely on the precipitation temperature.

Especially suitable as volatile Si-nitrogen compounds are:

(a) alkyl and arylaminosilanes or alkly and arylaminoalkylsilane $$Si(NRR')_4$$

or $$R_{(4-n)}Si(NRR')_n$$

R=H, alkyl, phenyl
R'=H, alkyl, phenyl
*n*=1, 2, 3, 4.

(b) Alkyl= and arylaminosilazane $$(R'RN)_{3-m}SiR_m-\underset{R}{N}-SiR_{m'}(NRR')_{3-m'}$$

*m, m'*=1, 2, 3

(c) Cyclic Si-N compounds of (a) and (b) for example

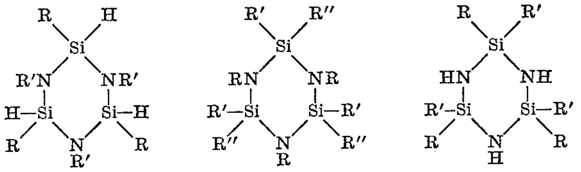

(d) Silicon-isocyanate (melting point 26°, boiling point 185.6°)

$$Si(NCO)_4$$

(e) In place of alkyl-aminoalkylsilanes, a gaseous mixture of alkylaminosilane may be brought into reaction with ammonia or alkylamines and hydrogen. At temperatures above 700° this also results in the coating of silicon nitrides.

Schematically:

$$\left.\begin{matrix}SiR_4 + NH_3\\ \text{or}\\ SiR_4 + H_2NR + H_2\end{matrix}\right\} \longrightarrow \begin{matrix}\text{Si-nitride}\\ \text{+hydrocarbon}\\ \text{+hydrogen}\end{matrix}$$

In selecting a carrier gas the nature of the volatile silicon nitrogen compound must be taken into account. To be considered is whether silicon atoms are bound only to nitrogen or whether Si—C or Si—H compounds are also present. In the first instance noble gases, hydrogen or nitrogen alone or mixtures thereof, may be used as a carrier gas; in the second instance, an addition of ammonia or gaseous alkylamine is necessary for the above carrier gases when the atom ratio N:Si is less than 1.5:1. The use of a hydrogen and/or $NH_3$ containing atmosphere is always advantageous for facilitating the separation of alkyl groups.

The analogy of the method of our invention with conventional epitaxy from gaseous phase of silicon, germanium and other semiconductor layers raises the possibility of obtaining silicon nitride, which in a monocrystalline state in a semiconductor, in the form of a monocrystalline layer on a semiconductor body of, for example silicon or silicon-carbide. For example, it is possible to obtain on a substrate comprised of silicon or silicon carbide with (111) precipitation surface, monocrystalline $Si_3N_4$ layers, if the combination of the reaction gas is gradually changed during the precipitation process, so that initially, virtually only the semiconductor of the substrate is precipitated with a slight mixture with the silicon nitride and only then gradually increasing the share of silicon-nitride while correspondingly decreasing the share of the substrate semiconductor during precipitation, until finally only silicon nitride is precipitated. The adjusting forces of the silicon, or of the silicon carbide lattice, may in this way finally result in an oriented precipitation of the silicon nitride. The use of such monocrystalline silicon nitride layers as semiconductors is entirely feasible.

We claim:

1. A method of producing a silicon nitride protective layer compound at the surface of a semiconductor crystal, by thermal precipitation from the reaction gas, which comprises thermally decomposing a reaction gas consisting essentially of a metal-free volatile compound of nitrogen and silicon which contains an Si-N bond and at least one organic radical, said compound being selected from the group consisting of alkyl and arylaminosilane, alkyl and arylaminoalkylsilane, and alkyl and arylaminosilazane.

2. The method of claim 1, wherein the semiconductor crystal is selected from silicon, germanium and $A^{III}B^{V}$ compounds.

3. The method of claim 2, wherein an aminosilazane is used to precipitate silicon nitride.

4. The method of claim 2 in which tetrakisdimethylaminosilane is used to precipitate silicon nitride.

5. The method of claim 2, wherein an aminosilane is used to precipitate silicon nitride.

6. The method of claim 5, wherein an alkylaminosilane is reacted with ammonia at pyrolytic temperature to precipitate the silicon nitride layer.

7. The method of claim 5, wherein an alkylaminosilane is reacted with alkylamine and hydrogen at pyrolytic temperature to precipitate the silicon nitride layer.

References Cited

UNITED STATES PATENTS

| | | | |
|---|---|---|---|
| 3,149,398 | 9/1964 | Sprague et al. | 117—106X |
| 3,246,214 | 4/1966 | Hugle | 317—235 |
| 3,386,918 | 6/1968 | Hough et al. | 117—106UX |

FOREIGN PATENTS

| | | | |
|---|---|---|---|
| 1,190,308 | 3/1959 | France | 117—106 |

OTHER REFERENCES

Ephraim, F.: Inorganic Chemistry, 6th ed., by P. C. L. Thorne and E. R. Roberts; Oliver-Boyd; London, England, 1954, pp. 662–3.

Storr, R., Wright, A. N., Winkler, C. A.: Reactions of Active Nitrogen with Boron Trichloride and Germane, in Canadian Journal of Chemistry, 40 pp. 1299–1301, 1962.

Semiconductor Device, in Chemical Abstracts, 63 (1965), 1321h, in Electronics, 39, Jan. 10, 1966, p. 164.

ALFRED L. LEAVITT, Primary Examiner

C. K. WEIFFENBACH, Assistant Examiner

U.S. Cl. X.R.

23—191; 117—106, 135.1

UNITED STATES PATENT OFFICE

CERTIFICATE OF CORRECTION

Patent No. 3,574,677 Dated April 13, 1971

Inventor(s) Erich Pammer et al.

It is certified that error appears in the above-identified patent and that said Letters Patent are hereby corrected as shown below:

Priority date should read -- April 29, 1966 --.

Signed and sealed this 31st day of August 1971.

(SEAL)
Attest:

EDWARD M.FLETCHER,JR.
Attesting Officer

ROBERT GOTTSCHLAK
Acting Commissioner of Pat